United States Patent [19]
Shulman

[11] Patent Number: 6,069,532
[45] Date of Patent: May 30, 2000

[54] TECHNIQUE FOR DESIGNING A BIAS CIRCUIT FOR AN AMPLIFIER IN AN INTEGRATED CIRCUIT DEVICE

[75] Inventor: Dima David Shulman, Ocean, N.J.

[73] Assignee: Lucent Technologies Inc., Murray Hill, N.J.

[21] Appl. No.: 09/119,431

[22] Filed: Jul. 20, 1998

[51] Int. Cl.[7] .................................................. H03F 3/45
[52] U.S. Cl. ............................................ 330/253; 330/261
[58] Field of Search ................................... 330/253, 255, 330/257, 252, 261

[56] References Cited

U.S. PATENT DOCUMENTS

| | | | |
|---|---|---|---|
| 4,893,092 | 1/1990 | Okamoto et al. | 330/253 |
| 5,442,319 | 8/1995 | Seesink et al. | 330/261 |
| 5,907,259 | 5/1999 | Yamada et al. | 327/563 |

Primary Examiner—Benny Lee
Assistant Examiner—Henry Choe

[57] ABSTRACT

In a class AB amplifier circuit for use in an integrated circuit (IC) device, a bias circuit is used to bias a first field effect transistor (FET) in an output stage. A second FET in the bias circuit is connected to the first FET. The drain current of the first FET contributes to the output of the amplifier circuit. In response to a difference in inputs to the amplifier circuit in a transient state, the second FET operates in a non-saturation mode especially when the voltage of the power supply to the amplifier circuit is required to be low, e.g., 2 volts. As a result, an input voltage to the first FET which operates in a saturation mode increases, thereby increasing its drain current contributing to the amplifier circuit output. This increased drain current advantageously prevents the otherwise significant distortion in the amplifier circuit output during the transient state.

21 Claims, 3 Drawing Sheets

100

300

TECHNIQUE FOR DESIGNING A BIAS CIRCUIT FOR AN AMPLIFIER IN AN INTEGRATED CIRCUIT DEVICE

FIELD OF THE INVENTION

The invention relates to an integrated circuit (IC) design, and more particularly to a technique for designing a bias circuit for use in an amplifier in an IC device powered by a low voltage source, e.g., about 2 volts.

BACKGROUND OF THE INVENTION

Nowadays, use of integrated circuit (IC) devices is ubiquitous. Some of these IC devices provide both analog and digital functions in a single package. One such IC device may be a digital signal processor (DSP), which typically includes analog amplifiers and digital circuits for processing an input signal.

It is desirable to design an IC device to have a low power consumption especially when the device is employed in a battery powered apparatus, e.g., a wireless telephone handset, which is common. Since the battery in such an apparatus has a limited capacity, the lifetime of the battery before replacement or recharging thereof increases as the power consumption of the IC device decreases. To reduce power consumption in an IC device, it has been proposed that the voltage of the power supply to the IC device is to be reduced from about 3 volts presently to about 2 volts in the near future.

A typical analog amplifier is realized in an IC device using field effect transistors (FETs), e.g., metal-oxide semiconductor FETs (MOSFETs). Such an amplifier comprises a current-mirror circuit, an output stage, and a differential amplifier which receives inverting and non-inverting inputs to the amplifier, respectively. In the typical amplifier, an FET in the output stage, referred to as an "output bias" transistor, is biased with a constant current dictated by the current-mirror circuit. The drain current of such an FET contributes to the current which drives a load, e.g., a resistive load, at the output of the amplifier.

However, the prior art analog amplifier just described is a class A amplifier which, as is well known, constantly provides a significant amount of current to the amplifier output, regardless of whether it is in a steady state or transient state. Although such a class A amplifier desirably provides substantially linear amplification, and introduces virtually no distortion into the output, especially during the transient state for which the significant amount of output current is required, the power consumption by the amplifier is undesirably high because of its provision of such a significant amount of output current all the time, notwithstanding that the power supply voltage to the amplifier is reduced.

SUMMARY OF THE INVENTION

The present invention stems from my recognition that the output current required of an analog amplifier is relatively low during its steady state and relatively high during its transient state without introducing significant distortion into the amplifier output. In accordance with the invention, the output stage of the amplifier is no longer biased by a constant current as in prior art. Rather, an inventive bias circuit is used to provide to the output stage a bias which varies with the inputs, and in particular with a difference between the inputs, of the amplifier.

Using the inventive bias circuit, the analog amplifier becomes a class AB amplifier which provides a relatively low output current during a steady state, with respect to that of the prior art class A amplifier. Such a relatively low output current is sufficient to prevent significant distortion in the amplifier output in the steady state, and at the same time advantageously incurs a reduced power consumption with respect to that of the prior art class A amplifier. In a transient state, depending on the amplifier inputs, and in particular on the difference therebetween, the bias by the inventive bias circuit may cause an input voltage to the aforementioned output bias transistor in the output stage to increase, despite a low power supply voltage, e.g., 2 volts, to the amplifier. This results in an increase in the current by the output bias transistor which contributes to the amplifier output, thereby advantageously preventing introducing significant distortion into such an output during the transient state.

BRIEF DESCRIPTION OF THE DRAWING

In the drawing.

Throughout this disclosure, unless otherwise stated, like elements, components or sections in the figures are denoted by the same numeral.

DETAILED DESCRIPTION

Figure 1:
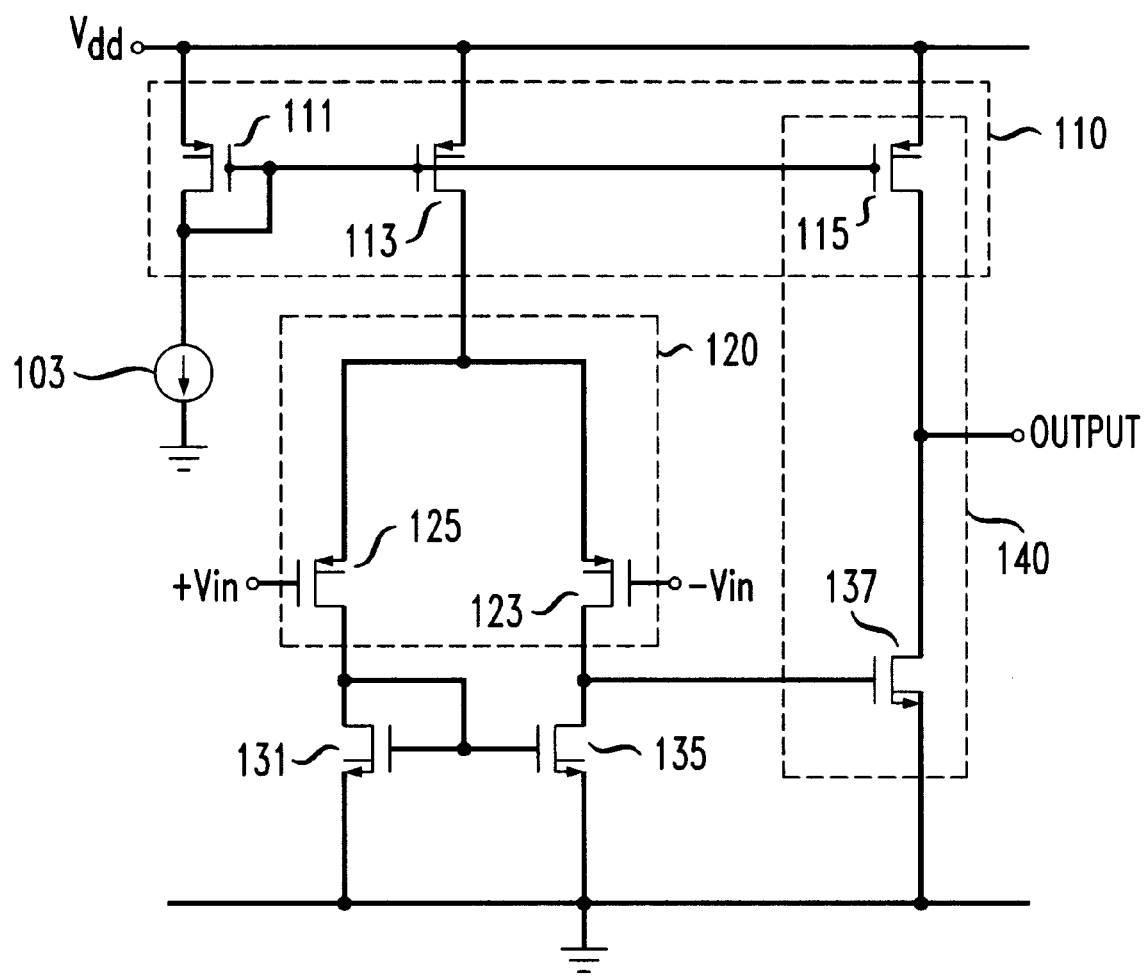
FIG. 1 illustrates a prior art amplifier circuit for use in an IC device.

FIG. 1 illustrates prior art amplifier circuit 100 embodied in an integrated circuit (IC) device. The IC device may be a conventional digital signal processor (DSP). In circuit 100, the voltage of a power supply to the IC device is denoted $V_{dd}$. Circuit 100 includes current-mirror circuit 110 which comprises p-channel field effect transistors (pFETs) 111, 113 and 115. The latter are connected to one another by their respective gate terminals. In a conventional manner, current source 103 is used to bias pFET 111, pFET 113 and pFET 115 to establish stable operating points thereof. Assuming that the geometric dimensions of pFETs 111, 113 and 115 in current-mirror circuit 110 are identical, and each pFET operates in a saturation region of its output characteristics, which is typical in prior art, the amount of the drain current provided by each pFET is constant and substantially the same.

Current-mirror circuit 110 is connected to differential amplifier 120 which includes pFET 123 and pFET 125. The gate terminal of pFET 123 is used to receive an inverting input signal, denoted −Vin, while the gate terminal of pFET 125 is used to receive a non-inverting input signal, denoted +Vin. Circuit 100 provides a substantial gain to the difference between the level of the inverting input signal and that of the non-inverting input signal. In addition, n-channel FETs (nFETs) 131 and 135 constitute an active load to differential amplifier 120. The output of differential amplifier 120 is taken from a common drain connection between pFET 123 and nFET 135 to drive output stage 140 comprising pFET 115 and nFET 137. In output stage 140, pFET 115, referred to as an "output bias" transistor, is biased with a constant current dictated by current mirror circuit 110 described before. The drain current of pFET 115 contributes to the current which drives a load, e.g., a resistive load, at the output of circuit 100.

It is desirable to design an IC device to have a low power consumption especially when the device is employed in a battery powered apparatus, e.g., a wireless telephone handset, which is common. Since the battery in such an apparatus has a limited capacity, the lifetime of the battery before replacement or recharging thereof increases as the power consumption of the IC device decreases. To reduce power consumption in an IC device, it has been proposed that the voltage of the power supply to the IC device is to be reduced from about 3 volts presently to about 2 volts in the near future.

However, prior art amplifier circuit 100 described above is a class A amplifier which, as is well known, constantly provides a significant amount of current to the amplifier output, regardless of whether it is in a steady state or transient state. Although such a class A amplifier desirably provides substantially linear amplification, and introduces virtually no distortion into the output, especially during the transient state for which the significant amount of output current is required, the power consumption by the amplifier is undesirably high because of its provision of such a significant amount of output current all the time, notwithstanding that the power supply voltage to the amplifier is reduced.

The present invention stems from my recognition that the output current required of an analog amplifier is relatively low during its steady state and relatively high during its transient state without introducing significant distortion into the amplifier output. In accordance with the invention, the output stage of the amplifier is no longer biased by a constant current as in prior art. Rather, an inventive bias circuit is used to provide to the output stage a bias which varies with the inputs, and in particular with a difference between the inputs, of the amplifier.

Using the inventive bias circuit, the amplifier becomes a class AB amplifier which provides a relatively low output current during a steady state, with respect to that of amplifier circuit 100. Such a relatively low output current is sufficient to prevent significant distortion in the amplifier output in the steady state, and at the same time advantageously incurs a reduced power consumption with respect to that of amplifier circuit 100. In a transient state, depending on the amplifier inputs, and in particular on the difference therebetween, the bias by the inventive bias circuit may cause an input voltage to the aforementioned output bias transistor in the output stage to increase, despite a low power supply voltage, e.g., 2 volts, to the amplifier. This results in an increase in the current by the output bias transistor which contributes to the amplifier output, thereby advantageously preventing introducing significant distortion into such an output during the transient state.

Figure 2:
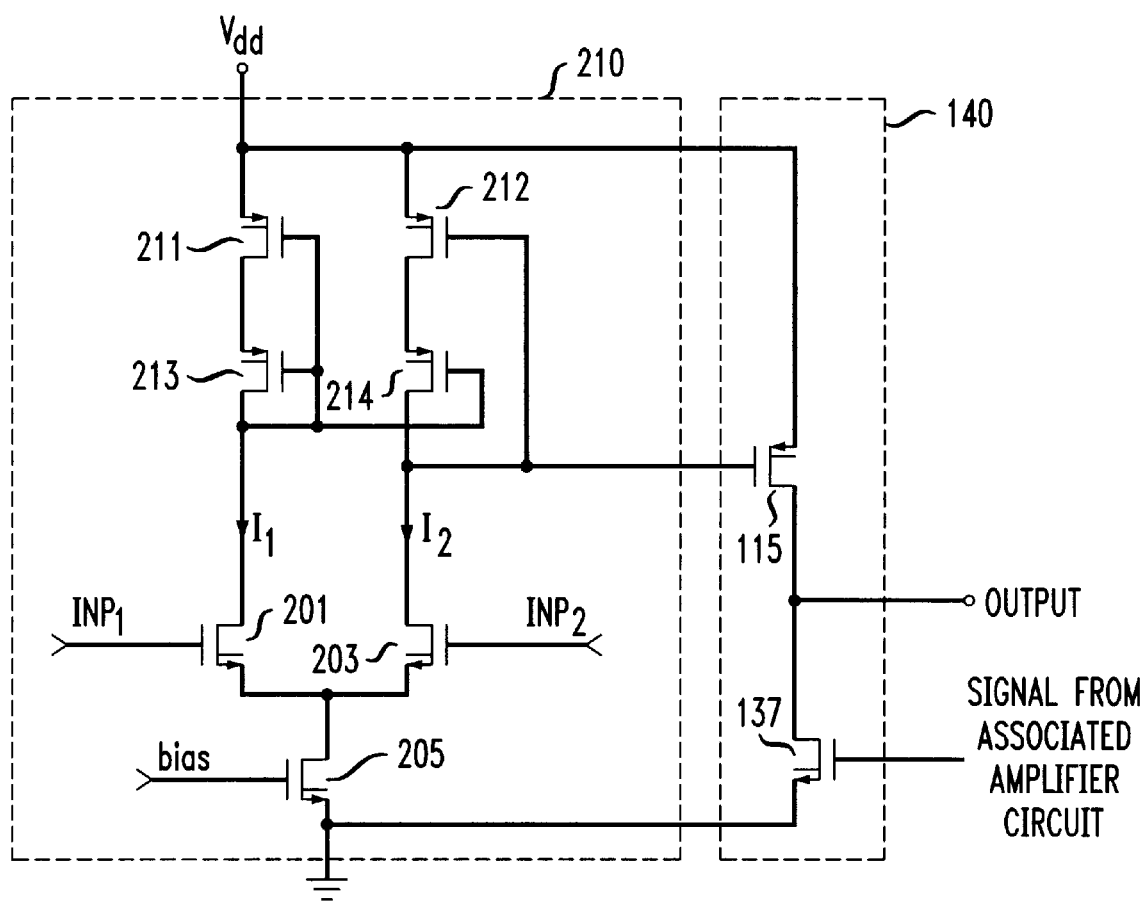
FIG. 2 illustrates a bias circuit in accordance with the invention for biasing an output stage of an amplifier circuit in an IC device.

FIG. 2 illustrates the bias circuit in accordance with the invention, which is denoted 210, and used to bias an output stage of an amplifier circuit, e.g., output stage 140. Circuit 210 takes in a version of a non-inverting input, $INP_1$, of the amplifier circuit associated therewith (not shown in FIG. 2) through the gate terminal of nFET 201, and a version of an inverting input, $INP_2$, of the amplifier circuit through the gate terminal of nFET 203. Circuit 210 is biased in a conventional manner by receiving a bias current through the gate terminal of NFET 205. During a steady state, i.e., the inverting and non-inverting inputs being balanced, a first current, denoted $I_1$, which flows through pFET 211 and pFET 213, and a second current, denoted $I_2$, which flows through pFET 212 and pFET 214 are identical in magnitude. In addition, pFET 212 operates in the saturation region of its output characteristics.

Otherwise, in a transient state where the inverting and non-inverting inputs are unbalanced, the amounts of $I_1$ and $I_2$ vary accordingly. For example, when the inverting input moves higher than the non-inverting input, $I_2$ increases at the expense of $I_1$ as the sum of $I_1$ and $I_2$ remains the same. At the same time, the decrease in $I_1$ causes the gate voltage of pFET 213 with respect to ground to increase. Since the gate terminals of pFETs 213 and 214 are connected to each other, the gate voltage of pFET 214 with respect to ground increases as well. To afford the relatively large amount of $I_2$, the magnitude of the gate to source voltage of pFET 214 accordingly increases. As a result, the magnitude of the drain to source voltage of pFET 212 is significantly decreased, and pFET 212 is pushed from operating in the aforementioned saturation mode to a non-saturation mode. The output of bias circuit 210 is drawn from the common drain connection between pFET 214 and nFET 203, and is connected to the gate terminal of pFET 212. This output is used to bias pFET 115 in output stage 140 in accordance with the invention. The gate input to NFET 137 in output stage 140 comprises a signal provided by the associated amplifier circuit in a conventional manner.

Continuing the above example, in the non-saturation mode, pFET 212 has an extremely low gate voltage with respect to its source voltage, which is $V_{dd}$, to afford the relatively large amount of $I_2$ flowing therethrough. Since the gate terminal of pFET 212 is connected to that of pFET 115, the gate voltage of pFET 115 is equally low with respect to $V_{dd}$, which equals its source voltage. However, unlike pFET 212, pFET 115 operates in a saturation mode, and its drain current which contributes to the output of stage 140 is much higher than $I_2$, thereby significantly increasing the amount of current driving the output during the transient state. Thus, with bias circuit 210, output stage 140 becomes a class AB output stage which provides a low steady state current to the output, and is capable of providing a much larger current to same during the transient state.

Figure 3:
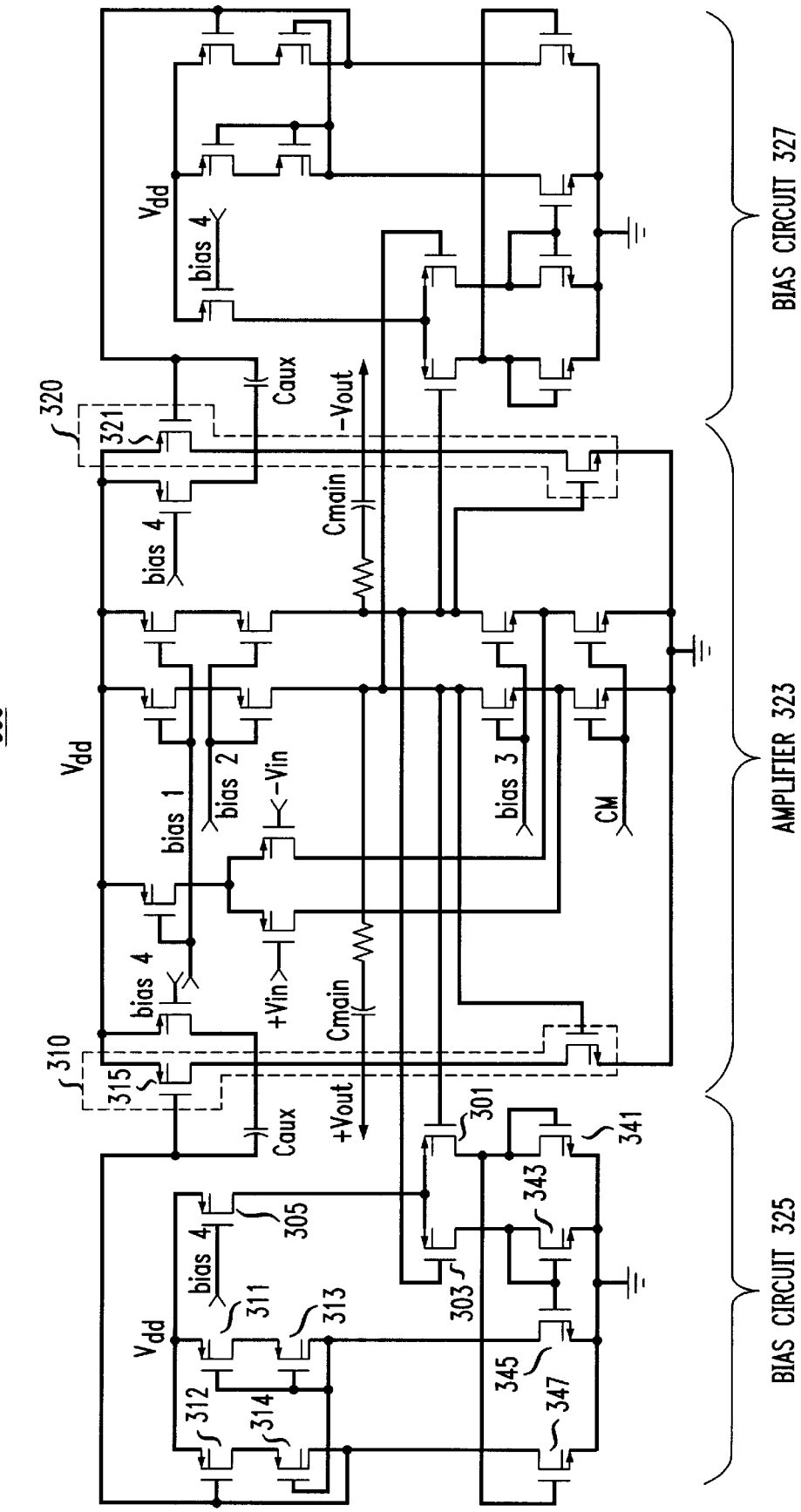
FIG. 3 illustrates an amplifier circuit for use in an IC device which incorporates the bias circuit in accordance with the invention.

FIG. 3 illustrates class AB amplifier circuit 300 in a fully differential CMOS implementation, which embodies the principles of the invention. Circuit 300 includes amplifier 323 of conventional design, and bias circuits 325 and 327 which are identical. Amplifier 323 is derived from prior art amplifier circuit 100 which is a single-ended design. As is well known, a fully differential IC circuit design is superior to its single-ended counterpart in terms of their noise immunity. Because of its fully differential design, amplifier 323 has two output stages, namely, non-inverting output stage 310 and inverting output stage 320. Output stage 310 provides a non-inverting output, denoted +Vout, and is biased using bias circuit 325 in accordance with the invention, while output stage 320 provides an inverting output, denoted −Vout, and is biased using bias circuit 327 in accordance with the invention. Each output stage is similar to output stage 140 described before. In particular, pFET 315 in stage 310 and pFET 321 in stage 320 each correspond to pFET 115 in stage 140.

Bias circuits 325 and 327 each are similar to bias circuit 210 described before. For example, pFETs 311, 312, 313 and 314 in bias circuit 325 correspond to pFETs 211, 212, 213 and 214 in bias circuit 210, respectively. However, FETs 301, 303 and 305 in bias circuit 325, which correspond to nFETs 201, 203 and 205 in bias circuit 210, respectively, are pFETs here as opposed to nFETs as in circuit 210. This change stems from a motivation to reduce the number of FETs in each branch of the resulting design of circuit 325, with respect to circuit 210. Referring briefly to FIG. 2, the number of FETs in each branch of circuit 210 between $V_{dd}$ and ground, e.g., the branch including pFET 212, pFET 214, nFET 203 and nFET 205, is 4. On the other hand, the number of FETs in each branch of circuit 325 in FIG. 3 between $V_{dd}$ and ground, e.g., the branch including pFET 305, pFET 301 and nFET 341, is 3. Thus, bias circuit 325 (or 327) is superior to circuit 210 in that the implementation with the smaller number of FETs in each branch in circuit 325 ensures that each FET in the branch would be on, despite a low $V_{dd}$. As a result, each output stage in amplifier circuit 300 is never completely off, thereby achieving a relatively low amplifier distortion.

In bias circuit 325, nFET 341 and nFET 347 constitute a current-mirror circuit whereby the current flowing through pFET 312 and pFET 314 mirrors that flowing through pFET 301. Similarly, nFET 343 and NFET 345 constitute another current-mirror circuit whereby the current flowing through pFET 311 and pFET 313 mirrors that flowing through pFET 303.

In a conventional manner, bias1, bias2, bias3 and bias4 are fixed biases provided by external sources to amplifier circuit 300. To stabilize amplifier circuit 300, a signal, denoted CM, is provided to circuit 300 from a common mode feedback control (not shown). As is well known, the signal level of CM is proportional to the average of the values of +Vin and −Vin. To further stabilize amplifier circuit 300, for example, capacitors Cmain and Caux are included to eliminate the otherwise ringing or oscillations appearing in the transient response of circuit 300, in accordance with the well known nested Miller compensation (NMC) technique. For details on such a technique, one may refer to: R. Eschauzier et al., "A 100-MHZ 100-dB Operational Amplifier with Multipath Nested Miller Compensation Structure," IEEE *J. Solid-State Circuits,* vol. 27, pp. 1709–1717, Dec. 1992.

The foregoing merely illustrates the principles of the invention. It will thus be appreciated that a person skilled in the art will be able to devise numerous arrangements which, although not explicitly shown or described herein, embody the principles of the invention and are thus within its spirit and scope.

For example, each of circuits 210 and 300 is disclosed herein in a form in which various functions are performed by discrete circuit elements, e.g., FETs. However, any one or more of these functions could equally well be embodied in an arrangement in which the functions of any one or more of those elements, and indeed all of the functions thereof, are realized, for example, by circuit elements other than the FETs, e.g., bipolar junction transistors, and/or by one or more sub-circuits equivalent thereto.

I claim:

1. A bias circuit for biasing an output stage in an amplifier, the bias circuit being external to the amplifier, the bias circuit comprising:

a first transistor element, which is connected to a second transistor element in the output stage of the amplifier, the second transistor element providing a current to an output of the amplifier; and a subcircuit responsive to at least one input to the amplifier for causing the first transistor element to operate in a non-saturation mode in a transient state and in a saturation mode in a steady state, an output of the first transistor element biasing the second transistor element to affect an amount of the current to the output of the amplifier.

2. The circuit of claim 1 wherein the first transistor element includes a field effect transistor (FET).

3. The circuit of claim 1 wherein the subcircuit includes a receiver for receiving a version of the at least one input to the amplifier.

4. The circuit of claim 3 wherein the version of the at least one input includes a first version of a first input to the amplifier and a second version of a second input to the amplifier.

5. The circuit of claim 4 wherein the subcircuit is responsive to a difference between the first version and the second version.

6. A circuit including an amplifier having a plurality of inputs for receiving first and second signals, respectively, the circuit comprising:

at least one bias subcircuit external to the amplifier, the bias subcircuit including a first transistor element;

at least one output stage, which includes a second transistor element, the second transistor element providing a current to an output of the circuit, an output of the first transistor element biasing the second transistor element, the second transistor element operating in a saturation mode in a transient state; and a second subcircuit external to the amplifier and responsive to signal levels of the first and second signals for causing the first transistor element to operate in a non-saturation mode in the transient state.

7. The circuit of claim 6 wherein at least one of the first and second transistor elements includes a FET.

8. The circuit of claim 6 comprising a class AB amplifier.

9. The circuit of claim 6 being in a fully differential form.

10. The circuit of claim 6 wherein the second subcircuit is responsive to a difference between the signal levels of the first and second signals.

11. The circuit of claim 6 further comprising at least one capacitor for stablizing the circuit.

12. A circuit comprising:

amplifier means for receiving an inverting input signal and a non-inverting input signal;

transistor means for providing a current to an output of the circuit;

biasing means, external to the amplifier means, for biasing the transistor means to affect an amount of the current, the biasing means including second transistor means which operates in a non-saturation mode in a transient state and in a saturation mode in a steady state; and means external to the amplifier means and responsive to a signal level of the inverting input signal and that of the non-inverting input signal for controlling the biasing means.

13. The circuit of claim 12 wherein the controlling means is responsive to a difference between the signal level of the inverting input signal and that of the non-inverting input signal.

14. A method for use in a bias circuit for biasing an output stage in an amplifier, the bias circuit being external to the amplifier and including a first transistor element, which is connected to a second transistor element in the output stage of the amplifier, the second transistor element providing a current to an output of the amplifier, the method comprising:

in response to at least one input to the amplifier, causing the first transistor element to operate in a non-saturation mode in a transient state and in a saturation mode in a steady state; and biasing the second transistor element using an output of the first transistor element to affect an amount of the current to the output of the amplifier.

15. The method of claim 14 further comprising receiving a version of the at least one input to the amplifier.

16. The method of claim 15 wherein the version of the at least one input includes a first version of a first input to the amplifier and a second version of a second input to the amplifier.

17. The method of claim 16 wherein the first transistor element is caused to operate in different modes in response to a difference between the first version and the second version.

18. A method for use in a circuit, which includes an amplifier having a plurality of inputs for receiving first and second signals, respectively, at least one bias subcircuit being external to the amplifier and including a first transistor element, and at least one output stage which includes a second transistor element, the method comprising:
   providing a current to an output of the amplifier using the second transistor element;
   biasing the second transistor element based on an output of the first transistor element, the second transistor element operating in a saturation mode in a transient state; and
   in response to signal levels of the first and second signals, causing the first transistor element to operate in a non-saturation mode in the transient state using a second subcircuit external to the amplifier.

19. The method of claim 18 wherein the second subcircuit is responsive to a difference between the signal levels of the first and second signals.

20. A method for use in a circuit which includes an amplifier, a bias subcircuit external to the amplifier and a second subcircuit external to the amplifier, the method comprising:
   receiving by the amplifier an inverting input signal and a non-inverting input signal;
   providing a current to an output of the circuit using a transistor element;
   biasing the transistor element to affect an amount of the current using the bias subcircuit which includes a second transistor element operating in a non-saturation mode in a transient state and in a saturation mode in a steady state; and
   controlling the biasing using the second subcircuit in response to a signal level of the inverting input signal and that of the non-inverting input signal.

21. The method of claim 20 wherein the biasing is controlled in response to a difference between the signal level of the inverting input signal and that of the non-inverting input signal.

* * * * *